(12) United States Patent
Wang

(10) Patent No.: US 12,120,940 B2
(45) Date of Patent: Oct. 15, 2024

(54) DISPLAY PANEL WITH OPTICAL ADJUSTMENT MEMBER IN EDGE DISPLAY AREA AND MOBILE TERMINAL

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Huanhuan Wang, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 17/600,101

(22) PCT Filed: Jul. 20, 2021

(86) PCT No.: PCT/CN2021/107370
§ 371 (c)(1),
(2) Date: Sep. 30, 2021

(87) PCT Pub. No.: WO2022/267129
PCT Pub. Date: Dec. 29, 2022

(65) Prior Publication Data
US 2024/0049575 A1    Feb. 8, 2024

(30) Foreign Application Priority Data
Jun. 24, 2021 (CN) .......................... 202110704707.0

(51) Int. Cl.
*H10K 59/80*    (2023.01)
*H10K 59/122*   (2023.01)

(52) U.S. Cl.
CPC ......... *H10K 59/879* (2023.02); *H10K 59/122* (2023.02); *H10K 59/8791* (2023.02)

(58) Field of Classification Search
None
See application file for complete search history.

(56) References Cited

U.S. PATENT DOCUMENTS

| | | | |
|---|---|---|---|
| 2017/0069808 A1 | 3/2017 | Kim et al. | |
| 2018/0269429 A1* | 9/2018 | Kudo | H10K 59/873 |
| 2020/0111856 A1 | 4/2020 | Lee | |

(Continued)

FOREIGN PATENT DOCUMENTS

| | | |
|---|---|---|
| CN | 105810718 | 7/2016 |
| CN | 109216581 | 1/2019 |

(Continued)

*Primary Examiner* — Nduka E Ojeh

(57) ABSTRACT

Embodiments of the present disclosure provide a display panel and a mobile terminal. The display panel includes an edge display area located on a periphery of a central display area. A substrate, a light-emitting function layer located on the substrate, and an optical adjustment member disposed on the light-emitting function layer are disposed in the edge display area. A refractive index of a side of the optical adjustment member that is close to the light-emitting function layer is less than a refractive index of a side of the optical adjustment member that is away from the light-emitting function layer.

18 Claims, 3 Drawing Sheets

(56) References Cited

U.S. PATENT DOCUMENTS

2021/0050557 A1* 2/2021 Yun ................... H10K 50/85
2021/0217989 A1* 7/2021 Gao ................... H10K 50/858

FOREIGN PATENT DOCUMENTS

| CN | 109904347 | 6/2019 |
| CN | 110429126 | 11/2019 |
| CN | 111509020 | 8/2020 |
| CN | 111668281 | 9/2020 |
| CN | 111834544 | 10/2020 |
| CN | 112838176 | 5/2021 |

* cited by examiner

DISPLAY PANEL WITH OPTICAL ADJUSTMENT MEMBER IN EDGE DISPLAY AREA AND MOBILE TERMINAL

RELATED APPLICATIONS

This application is a National Phase of PCT Patent Application No. PCT/CN2021/107370 having International filing date of Jul. 20, 2021, which claims the benefit of priority of Chinese Patent Application No. 202110704707.0 filed on Jun. 24, 2021. The contents of the above applications are all incorporated by reference as if fully set forth herein in their entirety.

FIELD AND BACKGROUND OF THE INVENTION

The present disclosure relates to display technologies, and more particularly, to a display panel and a mobile terminal.

An active-matrix organic light-emitting diode (AMOLED) display panel is driven by a thin film transistor, so as to individually light up each pixel. The AMOLED display panel has the advantages of high brightness, high resolution, low power consumption, easy to achieve colorization and large-area display, and the like, and is a commonly used method currently.

In order to increase the screen-to-body ratio, the currently applied display panel adopts a screen having curved edges, and the edges of the screen are also used for display. However, because the display of the curved screen edges is at some angles, the brightness of the edges is lower than the brightness of the center, causing brightness differences on the whole screen, which affects the looking and feeling experience of the owner.

Therefore, a display panel and a mobile terminal are urgently required to resolve the above technical problems.

SUMMARY OF THE INVENTION

The display panel and the display screen of the mobile terminal of the prior art have a technical problem that the edge brightness is lower than the center brightness.

An embodiment of the present disclosure provides a display panel, including a central display area and an edge display area located on a periphery of the central display area, wherein a substrate, a light-emitting function layer located on the substrate, and an optical adjustment member disposed on the light-emitting function layer are disposed in the edge display area, wherein
  a refractive index of a side of the optical adjustment member that is close to the light-emitting function layer is less than a refractive index of a side of the optical adjustment member that is far away from the light-emitting function layer.

In the display panel provided in the embodiment of the present disclosure, a pixel define layer disposed on a same layer as the light-emitting function layer is further disposed in the edge display area, the pixel define layer includes a plurality of first pixel openings, the light-emitting function layer includes a plurality of first pixel units, and one first pixel unit corresponds to one first pixel opening; and
  the optical adjustment member includes a first optical adjustment layer disposed on a side wall of the first pixel opening and a second optical adjustment layer covering the first optical adjustment layer and the light-emitting function layer, and a refractive index of the first optical adjustment layer is less than a refractive index of the second optical adjustment layer.

In the display panel provided in the embodiment of the present disclosure, the first optical adjustment layer includes a flat portion disposed on the pixel define layer and an inclined portion disposed on the side wall of the first pixel opening and connected to the flat portion, wherein
  a slope angle of the inclined portion is greater than or equal to a slope angle of the side wall of the first pixel opening.

In the display panel provided in the embodiment of the present disclosure, the refractive index of the second optical adjustment layer gradually increases in a light-transmitting direction of the display panel.

In the display panel provided in the embodiment of the present disclosure, the refractive index of the second optical adjustment layer gradually increases from a central position to an edge position of the second optical adjustment layer.

In the display panel provided in the embodiment of the present disclosure, the display panel further includes a reflecting layer disposed on the side wall of the first pixel opening, and the reflecting layer is located between the pixel define layer and the first optical adjustment layer.

In the display panel provided in the embodiment of the present disclosure, a part of the pixel define layer that is located in the central display area further includes a plurality of second pixel openings, the light-emitting function layer further includes a plurality of second pixel units, and one second pixel unit corresponds to one second pixel opening, wherein
  the second pixel opening further includes the light-emitting function layer and the second optical adjustment layer disposed on the light-emitting function layer.

In the display panel provided in the embodiment of the present disclosure, a spacing between two adjacent second pixel openings is less than a spacing between two adjacent first pixel openings.

In the display panel provided in the embodiment of the present disclosure, a material of the optical adjustment member includes at least one of a photoresist and a metal oxide.

In the display panel provided in the embodiment of the present disclosure, the display panel further includes an array structure layer, a thin film encapsulation layer, a touch layer, a polarizing layer, and a cover plate layer.

The array structure layer is located on the substrate, the thin film encapsulation layer is located on the light-emitting function layer, the touch layer is located on the thin film encapsulation layer, and the polarizing layer is located on the touch layer. The light-emitting function layer is located on the array structure layer, and the optical adjustment member is located between the light-emitting function layer and the thin film encapsulation layer.

Correspondingly, an embodiment of the present disclosure further provides a mobile terminal, including a terminal body and a display panel that are combined as a whole, wherein
  the display panel includes a central display area and an edge display area located on a periphery of the central display area, and a substrate, a light-emitting function layer located on the substrate, and an optical adjustment member disposed on the light-emitting function layer are disposed in the edge display area, wherein
  a refractive index of a side of the optical adjustment member that is close to the light-emitting function layer is less than a refractive index of a side of the optical adjustment member that is far away from the light-emitting function layer.

In the mobile terminal provided in the embodiment of the present disclosure, a pixel define layer disposed on a same layer as the light-emitting function layer is further disposed in the edge display area, the pixel define layer includes a plurality of first pixel openings, the light-emitting function layer includes a plurality of first pixel units, and one first pixel unit corresponds to one first pixel opening; and the optical adjustment member includes a first optical adjustment layer disposed on a side wall of the first pixel opening and a second optical adjustment layer covering the first optical adjustment layer and the light-emitting function layer, and a refractive index of the first optical adjustment layer is less than a refractive index of the second optical adjustment layer.

In the mobile terminal provided in the embodiment of the present disclosure, the first optical adjustment layer includes a flat portion disposed on the pixel define layer and an inclined portion disposed on the side wall of the first pixel opening and connected to the flat portion, wherein a slope angle of the inclined portion is greater than or equal to a slope angle of the side wall of the first pixel opening.

In the mobile terminal provided in the embodiment of the present disclosure, the refractive index of the second optical adjustment layer gradually increases in a light-transmitting direction of the display panel.

In the mobile terminal provided in the embodiment of the present disclosure, the refractive index of the second optical adjustment layer gradually increases from a central position to an edge position of the second optical adjustment layer.

In the mobile terminal provided in the embodiment of the present disclosure, the display panel further includes a reflecting layer disposed on the side wall of the first pixel opening, and the reflecting layer is located between the pixel define layer and the first optical adjustment layer.

In the mobile terminal provided in the embodiment of the present disclosure, a part of the pixel define layer that is located in the central display area further includes a plurality of second pixel openings, the light-emitting function layer further includes a plurality of second pixel units, and one second pixel unit corresponds to one second pixel opening, wherein the second pixel opening further includes the light-emitting function layer and the second optical adjustment layer disposed on the light-emitting function layer.

In the mobile terminal provided in the embodiment of the present disclosure, a spacing between two adjacent second pixel openings is less than a spacing between two adjacent first pixel openings.

In the mobile terminal provided in the embodiment of the present disclosure, a material of the optical adjustment member includes at least one of a photoresist and a metal oxide.

In the mobile terminal provided in the embodiment of the present disclosure, the display panel further includes an array structure layer, a thin film encapsulation layer, a touch layer, a polarizing layer, and a cover plate layer.

The array structure layer is located on the substrate, the thin film encapsulation layer is located on the light-emitting function layer, the touch layer is located on the thin film encapsulation layer, and the polarizing layer is located on the touch layer. The light-emitting function layer is located on the array structure layer, and the optical adjustment member is located between the light-emitting function layer and the thin film encapsulation layer.

Embodiments of the present disclosure provide a display panel and a mobile terminal. The display panel includes an edge display area located on a periphery of a central display area. A substrate, a light-emitting function layer located on the substrate, and an optical adjustment member disposed on the light-emitting function layer are disposed in the edge display area. A refractive index of a side of the optical adjustment member that is close to the light-emitting function layer is less than a refractive index of a side of the optical adjustment member that is away from the light-emitting function layer. According to the present disclosure, the optical adjustment member is disposed in the edge display area, and the refractive index of the side of the optical adjustment member that is close to the light-emitting function layer is less than the refractive index of the side of the optical adjustment member that is away from the light-emitting function layer. In this way, external incident light is totally reflected at the interface of two materials having different refractive indexes, and this part of the light passes through the high refractive index film layer to emit light, thereby enhancing the brightness of the edge display area and making up for the difference in brightness between the edge display area and the central display area. Therefore, the contrast of the display panel is increased, and the light exit efficiency of the display panel is further improved.

DESCRIPTION OF PREFERRED SPECIFIC EMBODIMENTS OF THE INVENTION

Figure 1:
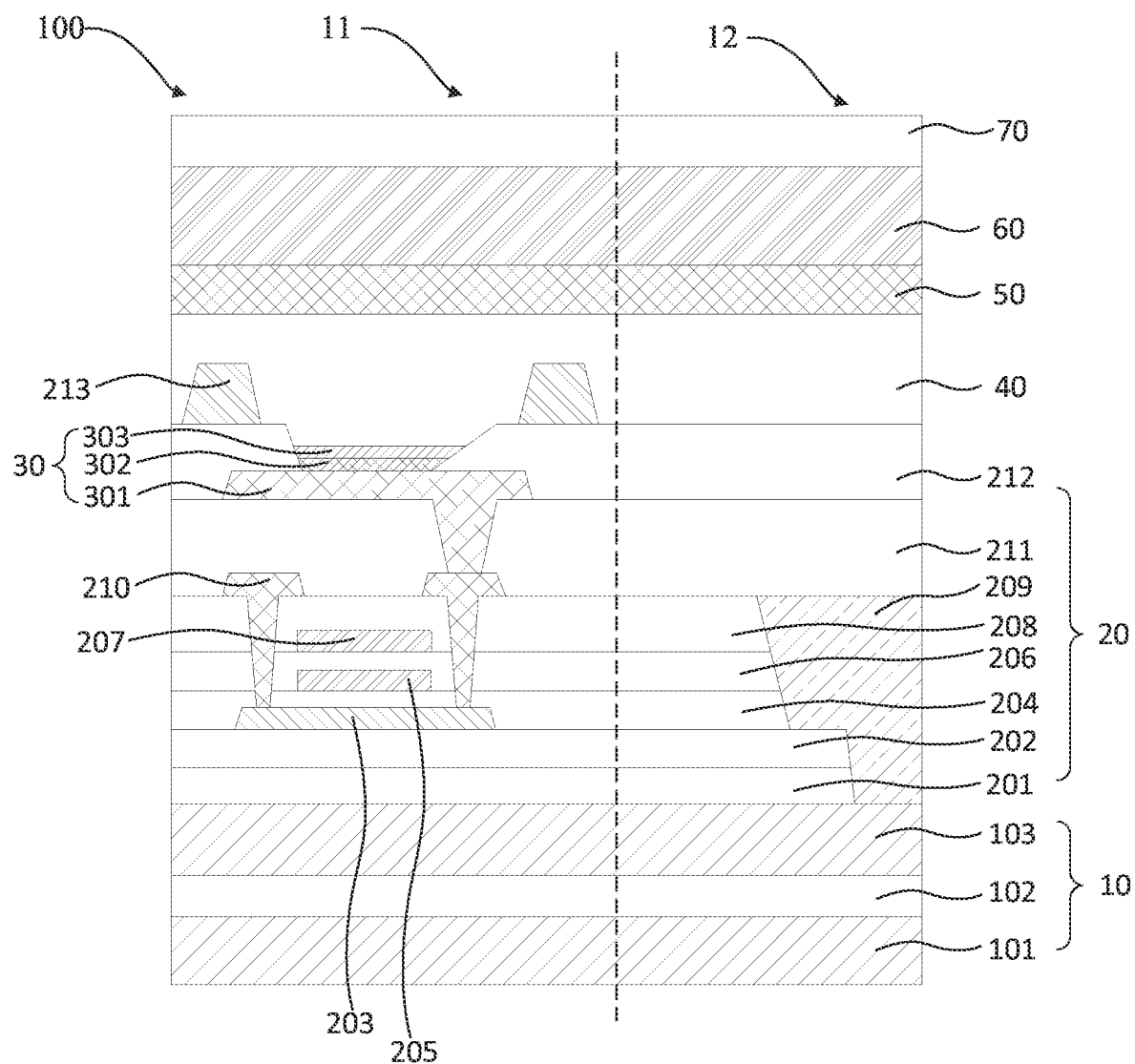
FIG. 1 is a diagram of a structure of cross-sections of a display panel according to a first embodiment of the present disclosure.

According to the embodiments of the present disclosure, the above technical problem that the brightness of the edge screen is lower than the brightness of the center screen due to the use of a curved edge screen of the display panel of the prior art can be resolved.

Referring to FIGS. 1 to 5, an embodiment of the present disclosure provides a display panel 100. The display panel includes a central display area 111 and an edge display area 112 located on a periphery of the central display area 111. A substrate 10, a light-emitting function layer 30 located on the substrate 10, and an optical adjustment member 80 disposed on the light-emitting function layer 30 are disposed in the edge display area 112. A refractive index of a side of the optical adjustment member 80 that is close to the light-emitting function layer 30 is less than a refractive index of a side of the optical adjustment member 80 that is far away from the light-emitting function layer 30.

According to the present disclosure, the optical adjustment member 80 is disposed in the edge display area 112, and the refractive index of the side of the optical adjustment member 80 that is close to the light-emitting function layer 30 is less than the refractive index of the side of the optical adjustment member 80 that is away from the light-emitting function layer 30. In this way, external incident light is totally reflected at the interface of two materials having different refractive indexes, and this part of the light passes through the high refractive index film layer to emit light, thereby enhancing the brightness of the edge display area 112 and making up for the difference in brightness between the edge display area 112 and the central display area 111. Therefore, the contrast of the display panel 100 is increased, and the light exit efficiency of the display panel 100 is further improved.

The technical solutions of the present disclosure are described below with reference to detailed embodiments.

Embodiment I

FIG. 1 is a diagram of a structure of cross-sections of a display panel 100 according to a first embodiment of the present disclosure. The display panel 100 provided in the present embodiment includes a display area 11 and a non-display area 12 located on a side of the display area 11.

In detail, a substrate 10, an array structure layer 20 located on the substrate 10, a light-emitting function layer 30 located on the array structure layer 20, a thin film encapsulation layer 40 located on the light-emitting function layer 30, a touch layer 50 located on the thin film encapsulation layer 40, a polarizing layer 60 located on the touch layer 50, and a cover plate layer 70 located on the polarizing layer 60 are disposed in the display area 11.

The array structure layer 20 includes a plurality of openings. The light-emitting function layer 30 includes a plurality of light-emitting devices. One light-emitting device corresponds to one opening. Exit light emitted by the light-emitting device is led out of the display panel 100 by means of the opening.

In detail, the substrate 10 is a flexible substrate, and includes a first flexible layer 101, a barrier layer 102 disposed on the first flexible layer 101, and a second flexible layer 103 disposed on the barrier layer 102 in detail.

In detail, the array structure layer 20 includes a first buffer layer 201 disposed on the second flexible layer 103, a second buffer layer 202 disposed on the first buffer layer 201, an active layer 203 disposed on the second buffer layer 202, a first gate insulating layer 204 disposed on the second buffer layer 202 and covering the active layer 203, a first gate layer 205 disposed on the first gate insulating layer 204, a second gate insulating layer 206 disposed on the first gate insulating layer 204 and covering the first gate layer 205, a second gate layer 207 disposed on the second gate insulating layer 206, an interlayer insulating layer 208 disposed on the second gate insulating layer 206 and completely covering the second gate layer 207, a source/drain metal layer 210 disposed on the interlayer insulating layer 208, a planarization layer 211 disposed on the interlayer insulating layer 208 and completely covering the source/drain metal layer 210, a pixel define layer 212 disposed on the planarization layer 211 and partially covering an anode metal layer 301, and a spacer layer 213 disposed on the pixel define layer 212.

The source/drain metal layer 210 is electrically connected to two ends of the active layer 203 using vias, and the anode metal layer 301 is electrically connected to the source/drain metal layer 210. An organic insulating layer 209 is disposed in a part of the non-display area 12 of the display panel 100. The organic insulating layer 209 sequentially extends through the interlayer insulating layer 208, the second gate insulating layer 206, the first gate insulating layer 204, the second buffer layer 202, and the first buffer layer 201 from top to bottom. The second flexible layer 103 is exposed. The objective of providing the organic insulating layer 209 in the embodiment of the present disclosure is mainly to reduce the stress generated when the display panel 100 is bent.

In the embodiment of the present disclosure, the light-emitting function layer 30 includes the anode metal layer 301, an organic light-emitting layer 302 disposed on the anode metal layer 301, and a cathode metal layer 303 disposed on the organic light-emitting layer 302.

Figure 2:
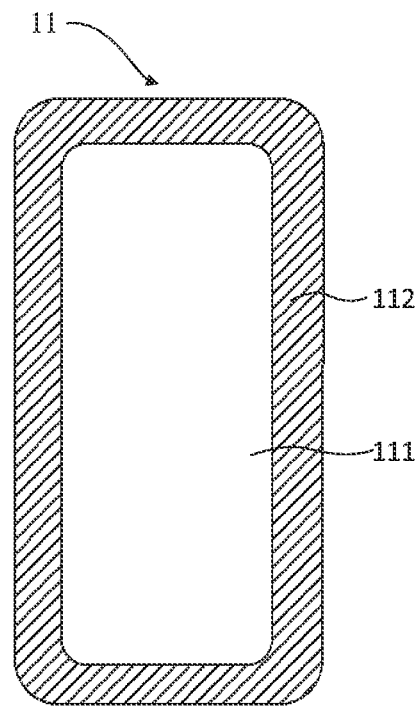
FIG. 2 is a schematic diagram of division of a display area in the display panel according to a first embodiment of the present disclosure.

FIG. 2 is a schematic diagram of division of a display area 11 in the display panel 100 according to a first embodiment of the present disclosure. The display area 11 includes a central display area 111 and an edge display area 112 located on a periphery of the central display area 111.

Figure 3:
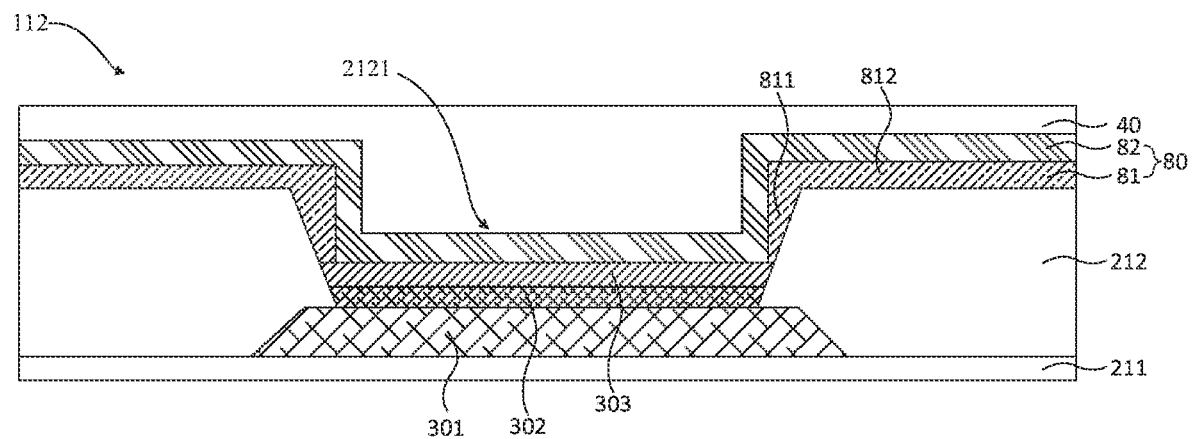
FIG. 3 is a diagram of a structure of a cross-section of the display panel located in an edge display area according to a first embodiment of the present disclosure.

FIG. 3 is a diagram of a structure of a cross-section of the display panel 100 located in an edge display area 112 according to a first embodiment of the present disclosure. A pixel define layer 212 disposed on a same layer as the light-emitting function layer 30 is further disposed in the edge display area 112. The pixel define layer 212 includes a plurality of first pixel openings 2121. The light-emitting function layer 30 includes a plurality of first pixel units. One first pixel unit corresponds to one first pixel opening 2121.

An optical adjustment member 80 is further disposed in the edge display area 112. The optical adjustment member 80 includes a first optical adjustment layer 81 disposed on a side wall of the first pixel opening 2121 and a second optical adjustment layer 82 covering the first optical adjustment layer 81 and the light-emitting function layer 30. A refractive index of the first optical adjustment layer 81 is less than a refractive index of the second optical adjustment layer 82.

In the embodiment of the present disclosure, the first optical adjustment layer 81 includes a flat portion 811 disposed on the pixel define layer 212 and an inclined portion 812 disposed on the side wall of the first pixel opening and connected to the flat portion 811.

A slope angle of the inclined portion 812 is greater than or equal to a slope angle of the side wall of the first pixel opening 2121.

Figure 4:
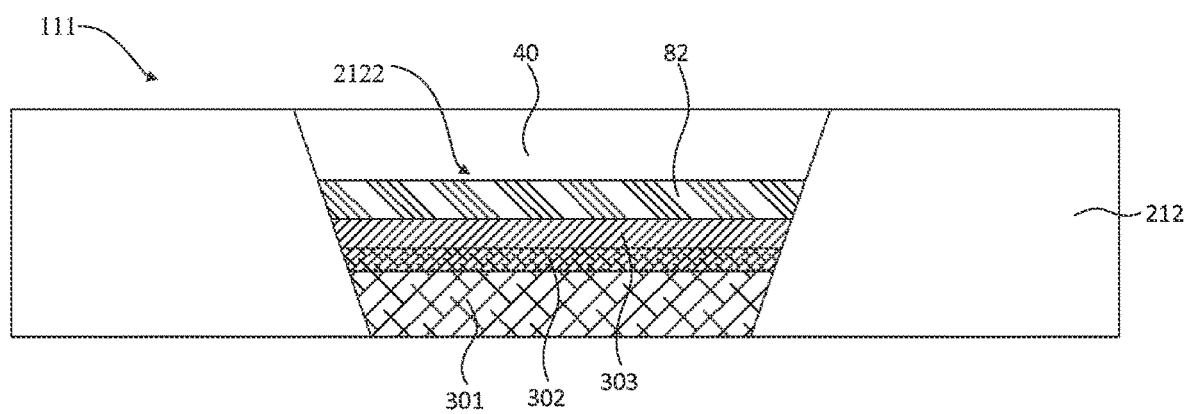
FIG. 4 is a diagram of a structure of a cross-section of the display panel located in a central display area according to a first embodiment of the present disclosure.

FIG. 4 is a diagram of a structure of a cross-section of the display panel 100 located in a central display area 111 according to a first embodiment of the present disclosure. A part of the pixel define layer 212 that is located in the central display area 111 further includes a plurality of second pixel openings 2122. The light-emitting function layer 30 further includes a plurality of second pixel units. One second pixel unit corresponds to one second pixel opening 2122.

The second pixel opening 2122 further includes the light-emitting function layer 30 and the second optical adjustment layer 82 disposed on the light-emitting function layer 30. The thin film encapsulation layer 40 covers the second optical adjustment layer 82.

In embodiment of the present disclosure, a spacing between two adjacent second pixel openings 2122 is equal to a spacing between two adjacent first pixel openings 2121.

In the embodiment of the present disclosure, a magnitude relationship between a refractive index $n_2$ of the second optical adjustment layer 82 and a refractive index $n_1$ of the first optical adjustment layer 81 is $n_2 > n_1$.

In detail, when the light emitted by the organic light-emitting layer 302 is transmitted to the first optical adjustment layer 81 through the second optical adjustment layer 82, the refractive index of the second optical adjustment layer 82 is greater than that of the first optical adjustment layer 81. Therefore, according to the principle of total reflection, from optically thick to optically thin, an exit light (θ>acrsin (n1/n2)) having an incident angle of θ cannot penetrate the first optical adjustment layer 81. The above exit light is totally reflected at the contact interface between the second optical adjustment layer 82 and the first optical adjustment layer 81, totally reflected into the second optical adjustment layer 82, and emitted to a light-emitting side of the display panel 100. Since part of the exit light in the edge display area 112 is totally reflected, but the exit light of the central display area 111 has not changed, the brightness of the edge display area 112 is enhanced, and a brightness difference between the edge display area and the central area that is generated by the viewing angle is made up.

For the above technical problem that the brightness of the edge screen is lower than the brightness of the center screen due to the use of a curved edge screen of the display panel 100 of the prior art, the embodiment of the present disclosure provides a display panel 100. The display panel 100 includes an edge display area 112 located on a periphery of a central display area 111. A substrate 10, a light-emitting function layer 30 located on the substrate 10, and an optical adjustment member 80 disposed on the light-emitting function layer 30 are disposed in the edge display area 112. A refractive index of a side of the optical adjustment member 80 that is close to the light-emitting function layer 30 is less than a refractive index of a side of the optical adjustment member 80 that is away from the light-emitting function layer 30. According to the present disclosure, the optical adjustment member 80 is disposed in the edge display area 112, and the refractive index of the side of the optical adjustment member 80 that is close to the light-emitting function layer 30 is less than the refractive index of the side of the optical adjustment member 80 that is away from the light-emitting function layer 30. In this way, external incident light is totally reflected at the interface of two materials having different refractive indexes, and this part of the light passes through the high refractive index film layer to emit light, thereby enhancing the brightness of the edge display area 112 and making up for the difference in brightness between the edge display area 112 and the central display area 111. Therefore, the contrast of the display panel 100 is increased, and the light exit efficiency of the display panel 100 is further improved.

Embodiment II

Figure 5:
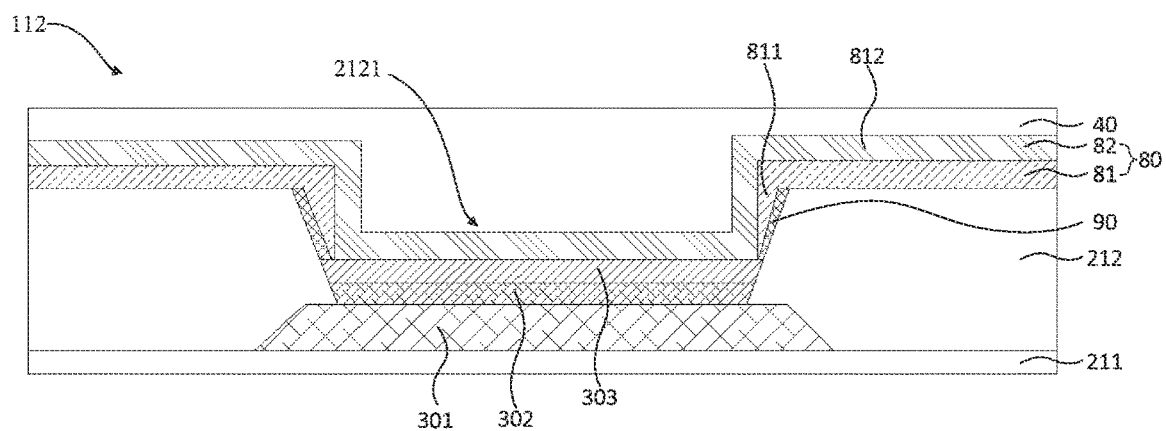
FIG. 5 is a diagram of a structure of a cross-section of a display panel located in an edge display area according to a second embodiment of the present disclosure.

FIG. 5 is a diagram of a structure of a cross-section of the display panel 100 located in an edge display area 112 according to a second embodiment of the present disclosure. The second embodiment of the present disclosure is same or similar to the first embodiment of the present disclosure, and the difference merely lies in that
the display panel 100 further includes a reflecting layer 90 disposed on a side wall of the first pixel opening 2121, and the reflecting layer 90 is located between the pixel define layer 212 and the first optical adjustment layer 81. The reflecting layer 90 is configured to reflect the light in the optical adjustment member 80, and can better converge the light entering the optical adjustment member 80, so as to further reduce the loss of light.

In embodiment of the present disclosure, the reflecting layer 90 is formed between the pixel define layer 212 and the first optical adjustment layer 81 by means of a deposition process, and a material of the reflecting layer 90 is metallic silver.

In embodiment of the present disclosure, a spacing between two adjacent second pixel openings 2122 is less than a spacing between two adjacent first pixel openings 2121. By means of such arrangement, a quantity of the first pixel units in the edge display area 112 can be increased, thereby making up for the brightness difference between the edge display area 112 and the central display area 111.

For the above technical problem that the brightness of the edge screen is lower than the brightness of the center screen in the display panel 100 of the prior art, the embodiment of the present disclosure provides a display panel 100. The display panel 100 includes an edge display area 112 located on a periphery of a central display area 111. A substrate 10, a light-emitting function layer 30 located on the substrate 10, and an optical adjustment member 80 disposed on the light-emitting function layer 30 are disposed in the edge display area 112. A refractive index of a side of the optical adjustment member 80 that is close to the light-emitting function layer 30 is less than a refractive index of a side of the optical adjustment member 80 that is away from the light-emitting function layer 30. According to the present disclosure, the optical adjustment member 80 is disposed in the edge display area 112, and the refractive index of the side of the optical adjustment member 80 that is close to the light-emitting function layer 30 is less than the refractive index of the side of the optical adjustment member 80 that is away from the light-emitting function layer 30. In this way, external incident light is totally reflected at the interface of two materials having different refractive indexes, and this part of the light passes through the high refractive index film layer to emit light. In addition, a reflecting layer 90 is disposed on a side wall of the pixel opening in the edge display area 112, and the reflecting layer 90 is located between the pixel define layer and the first optical adjustment layer 81. Compared with Embodiment I of the present disclosure, Embodiment II of the present disclosure further enhances the brightness of the edge display area 112, and further compensates for the brightness difference between the edge display area 112 and the central display area 111. In this way, the contrast of the display panel 100 is increased, and the light exit efficiency of the display panel 100 is further improved.

In the above embodiment of the present disclosure, the optical adjustment member 80 is made of a high-transmittance material, and transmittance of the high-transmittance material is generally required to be greater than 90%. By disposing a high-transmittance material, the light exit efficiency of the display panel 100 can be effectively improved.

In the above embodiment of the present disclosure, the refractive index n1 of the first optical adjustment layer 81 is in a range of $1<n1<1.5$, and the refractive index n2 of the second optical adjustment layer 82 is in a range of $1.7<n2<1.9$. By means of such arrangement, it can be ensured that the light emitted from the light-emitting function layer 30 can be totally reflected at the interface between the first optical adjustment layer 81 and the second optical adjustment layer 82 more easily.

In the above embodiments of the present disclosure, a material of the optical adjustment member 80 may be at least one of a photoresist, a metal oxide, an organic substance, and an inorganic substance, as long as the above two meet the requirements of the high transmittance and the refractive index.

In a solution of the above embodiments of the present disclosure, the refractive index of the second optical adjustment layer 82 gradually increases in the light-transmitting direction of the display panel 100. By means of such arrangement, the light emitted by the light-emitting function layer 30 can diverge after being refracted by the second optical adjustment layer 82, thereby increasing the light emission brightness of the display panel 100.

In another solution of the above embodiments of the present disclosure, the refractive index of the second optical adjustment layer 82 gradually increases from the central position to the edge position of the second optical adjustment layer 82. By means of such arrangement, the optical convergence of the light emitted by the light-emitting function layer 30 after being refracted by the second optical adjustment layer 82 can be enhanced, thereby increasing the contrast of the display panel 100.

In the above embodiments of the present disclosure, a material of the first flexible layer 101 and the second flexible layer 103 is polyimide, and a material of the barrier layer 102 is silicon nitride or silicon oxide. According to the embodiments of the present disclosure, a double-layer polyimide structure is used instead of a traditional glass substrate or a single-layer polyimide structure, so as to achieve the folding and flexible display of the display panel 100, while achieving better bending and water and oxygen barrier properties.

In the above embodiments of the present disclosure, the display panel 100 adopts a double-gate structure. The double-gate structure has better performance than a single-gate structure, such as higher electron mobility, larger on-state current, smaller sub-threshold swing, better stability and uniformity of the threshold voltage, better grid bias and illumination stability, and the like.

In the above embodiments of the present disclosure, the thin film encapsulation layer 40 includes a first inorganic encapsulation layer, an organic encapsulation layer, and a second inorganic encapsulation layer disposed from bottom to top.

Preferably, the first inorganic encapsulation layer and the second inorganic encapsulation layer are prepared using processes, such as plasma enhanced chemical vapor deposition (PECVD), an atomic layer deposition (ALD) technique, a pulsed laser deposition (PLD) technique, a sputtering technique, and the like.

Preferably, the first inorganic encapsulation layer and the second inorganic encapsulation layer have a same thickness. Materials of the first inorganic encapsulation layer and the second inorganic encapsulation layer are both any of $SiN_x$, $SiO_xN_y$, $SiO_x$, $SiC_xN_y$, ZnO, and $AlO_x$. A material of the organic encapsulation layer is polyimide or epoxy resin.

In the above embodiments of the present disclosure, the cover plate layer 70 is a glass cover plate and is formed on the polarizing layer 60 using a bonding process.

Correspondingly, an embodiment of the present disclosure further provides a mobile terminal. The mobile terminal includes the display panel 100 as in any described above. The mobile terminal is mainly applied to the active-matrix organic electroluminescence display panel 100, and has a broad application space in vehicles, mobile phones, tablets, computers, and television products.

The embodiments of the present disclosure provide a display panel 100 and a mobile terminal. The display panel 100 includes an edge display area 112 located on a periphery of a central display area 111. A substrate 10, a light-emitting function layer 30 located on the substrate 10, and an optical adjustment member 80 disposed on the light-emitting function layer 30 are disposed in the edge display area 112. A refractive index of a side of the optical adjustment member 80 that is close to the light-emitting function layer 30 is less than a refractive index of a side of the optical adjustment member 80 that is away from the light-emitting function layer 30. According to the present disclosure, the optical adjustment member 80 is disposed in the edge display area 112, and the refractive index of the side of the optical adjustment member 80 that is close to the light-emitting function layer 30 is less than the refractive index of the side of the optical adjustment member 80 that is away from the light-emitting function layer 30. In this way, external incident light is totally reflected at the interface of two materials having different refractive indexes, and this part of the light passes through the high refractive index film layer to emit light, thereby enhancing the brightness of the edge display area 112 and making up for the difference in brightness between the edge display area 112 and the central display area 111. Therefore, the contrast of the display panel 100 is increased, and the light exit efficiency of the display panel 100 is further improved.

In the above embodiments, the description of each embodiment has its own emphasis. For parts that are not described in detail in an embodiment, reference may be made to related descriptions of other embodiments.

The above describes in detail the display panel 100 and the mobile terminal provided by the embodiments of the present disclosure. Detailed examples are used in this specification to describe the principles and implementations of the present disclosure. The description of the above embodiments is only used to facilitate understanding of the technical solutions and the core idea of the present disclosure. A person of ordinary skill in the art should understand that modifications may be still made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A display panel, comprising a central display area and an edge display area located on a periphery of the central display area, wherein a substrate, a light-emitting function layer located on the substrate, and an optical adjustment member disposed on the light-emitting function layer are disposed in the edge display area, wherein
   a refractive index of a side of the optical adjustment member that is close to the light-emitting function layer is less than a refractive index of a side of the optical adjustment member that is far away from the light-emitting function layer,
   wherein a pixel define layer disposed on a same layer as the light-emitting function layer is further disposed in the edge display area, the pixel define layer comprises a plurality of first pixel openings, the light-emitting function layer comprises a plurality of first pixel units, and each of the first pixel units corresponds to each of the first pixel openings; and
   the optical adjustment member comprises a first optical adjustment layer disposed on a side wall of the first pixel opening and a second optical adjustment layer covering the first optical adjustment layer and the light-emitting function layer, and a refractive index of the first optical adjustment layer is less than a refractive index of the second optical adjustment layer.

2. The display panel as claimed in claim 1, wherein the first optical adjustment layer comprises a flat portion disposed on the pixel define layer and an inclined portion disposed on the side wall of the first pixel opening and connected to the flat portion, and a slope angle of the inclined portion is greater than or equal to a slope angle of the side wall of the first pixel opening.

3. The display panel as claimed in claim 1, wherein the refractive index of the second optical adjustment layer gradually increases in a light-transmitting direction of the display panel.

4. The display panel as claimed in claim 1, wherein the refractive index of the second optical adjustment layer gradually increases from a central position to an edge position of the second optical adjustment layer.

5. The display panel as claimed in claim 1, further comprising a reflecting layer disposed on the side wall of the first pixel opening, and the reflecting layer is located between the pixel define layer and the first optical adjustment layer.

6. The display panel as claimed in claim 1, wherein a part of the pixel define layer that is located in the central display area further comprises a plurality of second pixel openings, the light-emitting function layer further comprises a plurality of second pixel units, and one second pixel unit corresponds to one second pixel opening, wherein the second pixel opening further comprises the light-emitting function layer and the second optical adjustment layer disposed on the light-emitting function layer.

7. The display panel as claimed in claim 6, wherein a spacing between two adjacent second pixel openings is less than a spacing between two adjacent first pixel openings.

8. The display panel as claimed in claim 1, wherein a material of the optical adjustment member comprises at least one of a photoresist and a metal oxide.

9. The display panel as claimed in claim 1, further comprising:
an array structure layer, located on the substrate;
a thin film encapsulation layer, located on the light-emitting function layer;
a touch layer, located on the thin film encapsulation layer;
a polarizing layer, located on the touch layer; and
a cover plate layer, wherein
the light-emitting function layer is located on the array structure layer, and the optical adjustment member is located between the light-emitting function layer and the thin film encapsulation layer.

10. A mobile terminal, comprising a terminal body and a display panel that are combined as a whole, wherein the display panel comprises a central display area and an edge display area located on a periphery of the central display area, and a substrate, a light-emitting function layer located on the substrate, and an optical adjustment member disposed on the light-emitting function layer are disposed in the edge display area, wherein a refractive index of a side of the optical adjustment member that is close to the light-emitting function layer is less than a refractive index of a side of the optical adjustment member that is far away from the light-emitting function layer, wherein a pixel define layer disposed on a same layer as the light-emitting function layer is further disposed in the edge display area, the pixel define layer comprises a plurality of first pixel openings, the light-emitting function layer comprises a plurality of first pixel units, and each of the first pixel units corresponds to each of the first pixel openings; and the optical adjustment member comprises a first optical adjustment layer disposed on a side wall of the first pixel opening and a second optical adjustment layer covering the first optical adjustment layer and the light-emitting function layer, and a refractive index of the first optical adjustment layer is less than a refractive index of the second optical adjustment layer.

11. The mobile terminal as claimed in claim 10, wherein the first optical adjustment layer comprises a flat portion disposed on the pixel define layer and an inclined portion disposed on the side wall of the first pixel opening and connected to the flat portion, and a slope angle of the inclined portion is greater than or equal to a slope angle of the side wall of the first pixel opening.

12. The mobile terminal as claimed in claim 10, wherein the refractive index of the second optical adjustment layer gradually increases in a light-transmitting direction of the display panel.

13. The display panel as claimed in claim 10, wherein the refractive index of the second optical adjustment layer gradually increases from a central position to an edge position of the second optical adjustment layer.

14. The mobile terminal as claimed in claim 10, wherein the display panel further comprises a reflecting layer disposed on the side wall of the first pixel opening, and the reflecting layer is located between the pixel define layer and the first optical adjustment layer.

15. The mobile terminal as claimed in claim 10, wherein a part of the pixel define layer that is located in the central display area further comprises a plurality of second pixel openings, the light-emitting function layer further comprises a plurality of second pixel units, and one second pixel unit corresponds to one second pixel opening, wherein the second pixel opening further comprises the light-emitting function layer and the second optical adjustment layer disposed on the light-emitting function layer.

16. The mobile terminal as claimed in claim 15, wherein a spacing between two adjacent second pixel openings is less than a spacing between two adjacent first pixel openings.

17. The mobile terminal as claimed in claim 10, wherein a material of the optical adjustment member comprises at least one of a photoresist and a metal oxide.

18. The mobile terminal as claimed in claim 10, wherein the display panel further comprises:
an array structure layer, located on the substrate;
a thin film encapsulation layer, located on the light-emitting function layer;
a touch layer, located on the thin film encapsulation layer;
a polarizing layer, located on the touch layer; and
a cover plate layer, wherein
the light-emitting function layer is located on the array structure layer, and the optical adjustment member is located between the light-emitting function layer and the thin film encapsulation layer.

* * * * *